UP-CONVERTER AMPLIFIER CIRCUITS WITH ISOLATION

Filed Dec. 29, 1960 2 Sheets-Sheet 1

INVENTOR
R. S. ENGELBRECHT
BY David P. Kelley
ATTORNEY

UP-CONVERTER AMPLIFIER CIRCUITS WITH ISOLATION

Filed Dec. 29, 1960 2 Sheets-Sheet 2

INVENTOR
R. S. ENGELBRECHT
BY David P. Kelley
ATTORNEY

United States Patent Office 3,051,909

Patented Aug. 28, 1962

3,051,909

UP-CONVERTER AMPLIFIER CIRCUITS WITH ISOLATION

Rudolf S. Engelbrecht, Basking Ridge, N.J., assignor to Bell Telephone Laboratories, Incorporated, New York, N.Y., a corporation of New York Filed Dec. 29, 1960, Ser. No. 79,456
10 Claims. (Cl. 330—7)

This invention relates to parametric amplifiers and, more particularly, to parametric amplifiers of the frequency conversion type.

In general, parametric amplifiers utilize a variable reactance of one type or another to which is introduced a signal wave to be amplified and a pump wave which acts to vary the reactance to produce amplification. In the frequency conversion type of parametric amplifier, commonly known as an "up-converter," instead of the amplified input signal being the principal output, the sum or difference of the signal and pump frequencies constitutes the principal output. In an article entitled "Some General Properties of Nonlinear Elements—Part I. General Energy Relations" by J. M. Manley and H. E. Rowe, Proceeding of the Institute of Radio Engineers, Volume 44, pages 904–913, July 1956, there appears an exhaustive analysis of such devices, and certain relationships which characterize these devices are set forth. One of the principal relationships discussed is that of the gain of the sum frequency (or "noninverted") up-converter and it is therein shown that the power gain is directly proportional to the ratio of the output frequency to the input frequency. Thus it can be seen that for unconditional stability the gain of the system is limited by its high frequency handling capacities.

Although the gain of these devices is limited, they have a great deal of utility by virtue of their inherent low noise characteristics. Thus where high gain is not as important as low noise operation, these devices have proven most useful. In addition to their low noise characteristics, parametric up-converters are, basically, quite simple. Detracting from the simplicity, however, are the complications arising from the fact that such devices do not act to isolate the source of signals from the load. This inability to act as an isolator is due to the fact that the up-conversion gain in one direction through the amplifier is exactly equal to the down-conversion loss in the opposite direction. In a simple circuit, therefore, comprising, for example, a signal generator, an up-converter, and a load, signals at a frequency $f_1$ will be amplified and up-converted to a frequency $f_2$ and fed to the load. Reflected energy from the load at frequency $f_2$ will then be attenuated and down-converted to frequency $f_1$ and fed to the generator. Since the gain equals the loss, the up-converter appears to the generator as a simple passive element between it and a mismatched load. It can be appreciated that additional circuitry is required to provide a proper match and isolation between generator and load, such as circulators, isolators, and complex filters.

To a first order, up-conversion can produce two different output frequencies, depending upon whether the conversion is of the inverting type or the noninverting type. The noninverting up-conversion produces an output frequency equal to the sum of the input frequency and the pump frequency, while inverting up-conversion produces an output frequency equal to the pump frequency minus the input frequency. As pointed out in the foregoing, the up-converter cannot isolate the source from the load. In the case of the inverting up-converter, an additional problem arises from its inherent instability resulting from a regenerative action.

It is an object of this invention to produce up-conversion gain which is substantially greater than has heretofore been attainable.

It is another object of this invention to produce up-conversion gain in a device which provides materially greater isolation between the source and load.

Still another object of this invention is to produce up-conversion of either the inverting or noninverting type that is unconditionally stable over a wide band of frequencies.

These and other objects of the invention are achieved in a first illustrative embodiment thereof which comprises a source of signals, an up-converting network connected to the signal source, a source of pump energy connected to the up-converter, and a utilization circuit or load connected to the output of the up-converter. In accordance with my invention, the up-converting network comprises a parallel combination of a nonlinear variable reactance and a nonlinear variable resistance which are connected to the source of pump energy in such a manner that they are pumped in phase quadrature relative to each other. With such an arrangement, and as will be explained more fully hereinafter, signal energy introduced into the up-converting network is amplified and up-converted, and then fed to the load. On the other hand, energy reflected from the load is highly attenuated so that practical values of isolation between source and load are attained.

In a second illustrative embodiment of the invention, the nonlinear reactance and the nonlinear resistance are connected in series with each other and in shunt with the signal source and load. The two nonlinear elements are connected to the source of pump energy in such a manner that they are pumped in phase quadrature relative to each other.

In still another illustrative embodiment of the invention, the up-conversion network is followed by a down-conversion stage comprising a single nonlinear resistance element which is connected in parallel with the load or utilization circuit, whereby the energy supplied to the load is at the original signal frequency, but greatly amplified.

It is a feature of my invention that an up-converter parametric amplifier comprise a network having both a nonlinear variable reactance and a nonlinear variable resistance.

It is another feature of the present invention that the nonlinear elements which make up the up-converter are connected to a source of pump energy in such a manner that they are pumped in phase quadrature relative to each other.

These and other objects and features of the present invention will be more readily understood from the following description, taken in conjunction with the accompanying drawings, in which.

As pointed out heretofore, the Manley-Rowe relationships govern the behavior of parametric amplifiers. These relationships are based upon the assumption of an ideal (nondissipative) nonlinear reactance which varies at the pump frequency rate. Such an arrangement can be likened to a reflecting piston in a waveguide oscillating back and forth at the pump frequency, and it can be appreciated that such a piston alternately feeds energy to the system and extracts energy from it. From the Manley-Rowe relationships, the unconditionally stable gain of the up-converter is $$\frac{P_2}{P_1}=\frac{\omega_2}{\omega_1} \quad (1)$$

where $P_1$ and $P_2$ are input and output power respectively and $\omega_1$ and $\omega_2$ are input and output frequency respectively.

From the piston analogy, it can be seen that if the piston, instead of oscillating, were made to move continuously in one direction so as to feed energy continuously into the system, then the basic assumption leading to the Manley-Rowe relationships would be violated, and Equation 1 would no longer obtain. It can be shown mathematically that in a Doppler system, as such an arrangement can be designated, where the reflecting piston moves continuously at a velocity $v$ in a direction opposite to the incident wave $\omega_1$, the unconditionally stable gain of the system as an up-converter is $$\frac{P_2}{P_1}=\left(\frac{\omega_2}{\omega_1}\right)^2 \quad (2)$$

which is considerably higher than for a conventional up-converter governed by the Manley-Rowe relationships. It can also be shown that when the piston moves continuously away from the incident wave, thereby acting as a down-converter, the loss is considerably greater than for a conventional down-converter.

In the normal up-conversion process, as discussed by Manley and Rowe, there is always produced, in addition to the output signal, a second wave which is commonly designated the "idler." Because the idler differs in frequency from the output signal, various filtering and attenuating arrangements are necessary to dispose of it. In a Doppler type system, on the other hand, the idler wave is never generated, hence wide band tuning is possible without the necessity of mechanical tuning of filters. In addition, because there is no idler, the up-converter is unconditionally stable.

In practice, it is impossible to realize a piston which continuously moves in one direction only, space and time being the obvious limiting factors. As will be apparent hereinafter, it is possible, however, in accordance with my invention, to approximate the ideal Doppler piston and thereby overcome the limitations and disadvantages of the conventional type of up-converter as discussed by Manley and Rowe.

Figure 1:
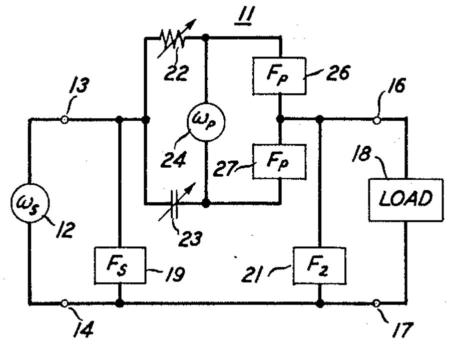
FIG. 1 is a diagrammatic view of one illustrative embodiment of my invention.

Turning now to FIG. 1, there is shown in block diagram, an up-converter amplifier 11 embodying the principles of the present invention. Amplifier 11 comprises a pair of input terminals 13, 14 across which is connected a source 12 of signals at a frequency $\omega_s$, and a pair of output terminals 16, 17 to which is connected a load or utilization device 18. Connected across input terminals 13, 14 is a filter 19, the purpose of which will be discussed more fully hereafter. In a like manner a filter 21 is connected across output terminals 16, 17. While the term "filter" is used hereinafter, in actuality such devices are nothing more than frequency selective tuned or resonant circuits. Between filters 19 and 21 is connected a parallel combination of a nonlinear variable resistance 22 and a nonlinear variable capacitance 23. Resistance 22 may be any one of a number of devices well known in the art such as a varistor diode, and capacitor 23 may be any one of a number of well-known devices, such as a semiconductor varactor diode. A source of pump energy 24 is connected across the circuit in such a manner that a closed series loop is formed with resistance 22, capacitor 23, and source 24. With such an arrangement, assuming resistor 22 is a substantially pure resistance and capacitor 23 is a substantially pure capacitance, they are pumped in substantially phase quadrature relationship. In practice, resistor 22 and capacitor 23 may not be "pure," in which case a phase shifter, not shown, can be inserted in the pump circuit. A pair of filters 26, 27 are connected as shown and are designed to be an open circuit at the pump frequency $\omega_p$ and a short circuit at all other frequencies. In this manner, pump energy is effectively prevented from reaching the output terminals, while any other frequencies are fed directly to the output.

In operation, signals at a frequency $\omega_s$ are applied at input terminals 13, 14. Filter 19 is designed to be an open circuit at $\omega_s$ and a short circuit at all other frequencies so that unwanted frequencies are shorted out while signal frequency $\omega_s$ is fed to the parallel combination of resistor 22 and capacitor 23. Within the parallel circuit, parametric interaction takes place in a manner which will be explained more fully hereinafter, and there will be produced a frequency $\omega_s+\omega_p$ (noninverted up-conversion) and a frequency $\omega_p-\omega_s$ (inverted up-conversion). Filter 21 may be designed to be an open circuit at either one of these two frequencies and a short circuit at all others, or it may be an open circuit at both frequencies, depending upon whether it is desired to have a single particular frequency or both frequencies at the output.

Figure 2:
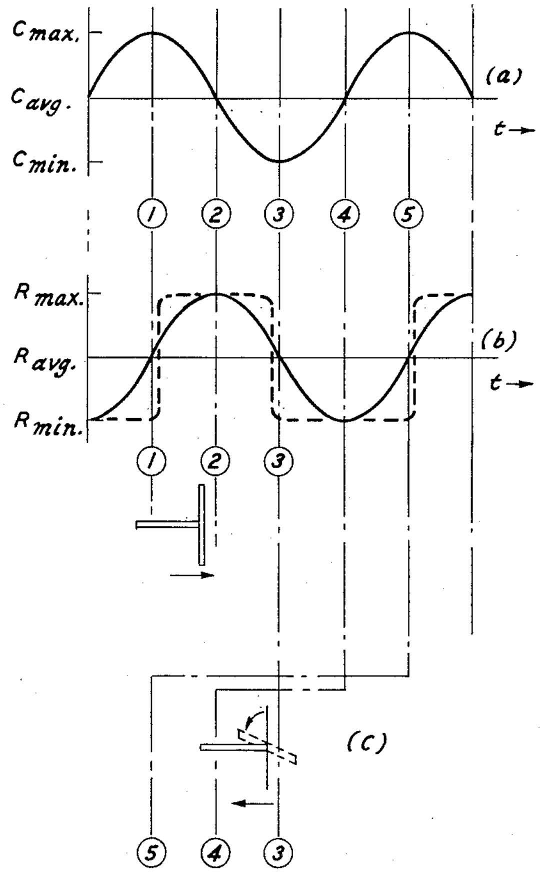
FIG. 2 is a series of diagrams for explaining the operation of the circuit of FIG. 1.

In FIG. 2 there are depicted the various parametric relationships which obtain during operation of the circuit 11 of FIG. 1 for one and one-half cycles of the pump wave at frequency $\omega_p$. FIG. 2A depicts the variation in capacitance of capacitor 23 with variations in the pump wave and FIG. 2B depicts the variation in resistance of resistor 22 with variations in the pump wave. That such variations do take place is well known and has been discussed at length in the prior art. It can be seen in FIGS. 2A and 2B that the variations in capacitance and resistance are in phase quadrature relative to each other. Thus, at time (1), when C is a maximum, R is at its average value and increasing. At time (2), C is decreasing and passing through its average value while R is at its maximum value.

FIG. 2C represents the Doppler action of the circuit 11, showing the action of a hypothetical piston as it oscillates back and forth at the pump frequency. Between times (1) and (3) the piston is moving from left to right which, as can be seen from FIG. 2A, is the half cycle of the pump wave when C decreases from a maximum to a minimum value. Since decreasing a capacitance constitutes putting energy into the system, the piston can be considered as doing work on the system and amplification and up-conversion are taking place. During the time period from (3) to (5) the piston is moving from right to left, and tends to extract work from the system. However, the piston is prevented from extracting work from the system by the action of the variable resistor 22. During the time from (1) to (3), as C was decreasing from a maximum to a minimum value it can be seen from FIG. 2B that the resistance R of resistor 22 was increasing from its average value to a maximum value and back to an average value. Inasmuch as resistor 22 and capacitor 23 are connected in parallel in circuit 11 of FIG. 1, resistance R presents a high impedance to flow of signal energy through its branch of the parallel circuit and, as a consequence, capacitor 23 is the principal parameter acting upon the incident signal energy. However, from the time (3) through (5), as the capacitance C of capacitor 23 is increasing, and as pointed out heretofore, energy tends to be extracted from the system, the resistance R of resistor 22 passes through its minimum value and presents to the incident signal energy, therefore, a very low impedance so that most of the signal energy flows through the branch of the parallel circuit containing resistor 22, and the effect of capacitor 23 on the signal energy is negligible. In terms of the diagram of FIG. 2C, this operation can be visualized as follows: from times (1) through (3) the face of the piston is a substantially pure reflecting surface, as is desirable in a Doppler type system. However, from times (3) to (5) it can be considered that the face of the piston has been flopped over (or, more precisely, masked by a low shunting resistance), as indicated by the dotted line at the end of the piston rod in FIG. 2C, so that its effect upon any incident wave energy is negligible. As was stated heretofore, it can be shown by mathematical analysis that the gain of such a system as depicted in FIG. 1 and discussed with reference to FIG. 2 approximates the ideal Doppler gain given in Equation 2, which is considerably higher than the gain obtainable with a simple parametric up-converter. It can also be shown that the down-conversion loss and, therefore, the isolation capabilities of the system are considerably higher than for a typical parametric up-converter provided the capacitor 23 and the resistor 22 are pumped at the correct amplitudes relative to each other. This can be appreciated from the diagram of FIG. 2C. Any energy at the output frequency which is reflected from the load 18 back into the circuit during the time period from (3) to (5) when down-conversion would normally occur, would not be down-converted in view of the masking of the piston action by the low shunting resistance of resistor 22. Thus it can be seen that there is substantially no down-conversion in the circuit 11 of FIG. 1. On the other hand, output energy reflected from the load when the piston is putting energy into the circuit and the resistance of resistor 22 is high will be up-converted, reflected back toward the load and filtered out.

In the foregoing, both the capacitor 23 and resistor 22 were shown to be pumped sinusoidally. Ideally, resistor 22 should be pumped by a square wave pump as indicated by the dotted lines in FIG. 2B. With such pumping, the resistance of resistor 22 would go from its maxima and minima substantially instantaneously, thereby assuring maximum resistance over substantially the entire half cycle from times (1) to (3) and a minimum resistance over the half cycle from (3) to (5). In practice it is possible to pump nonlinear varistor diodes with sufficient power that their resistance variations approach a square wave pattern. However, when pure square wave pumping is not available, and because there is generally a finite resistance for resistor 22 at any stage of the cycle of operation, Equation 2, which represents the ideal case, is modified to be $$G=A^2\left(\frac{\omega_2}{\omega_1}\right)^2 \qquad (3)$$

where $A^2$ is a constant proportional to the ratio of maxima and minima of the resistor 22 to its average value, and $$\frac{\omega_2}{\omega_1}\gg 1$$

which is the usual case in an up-converter. The constant $A^2$ approaches one as the maximum value of the resistor approaches infinity. Obviously, the greater the ratio of maximum to minimum values of the resistance, or the greater the non-linearity of the resistance, the greater the gain that is obtainable.

Figure 3:
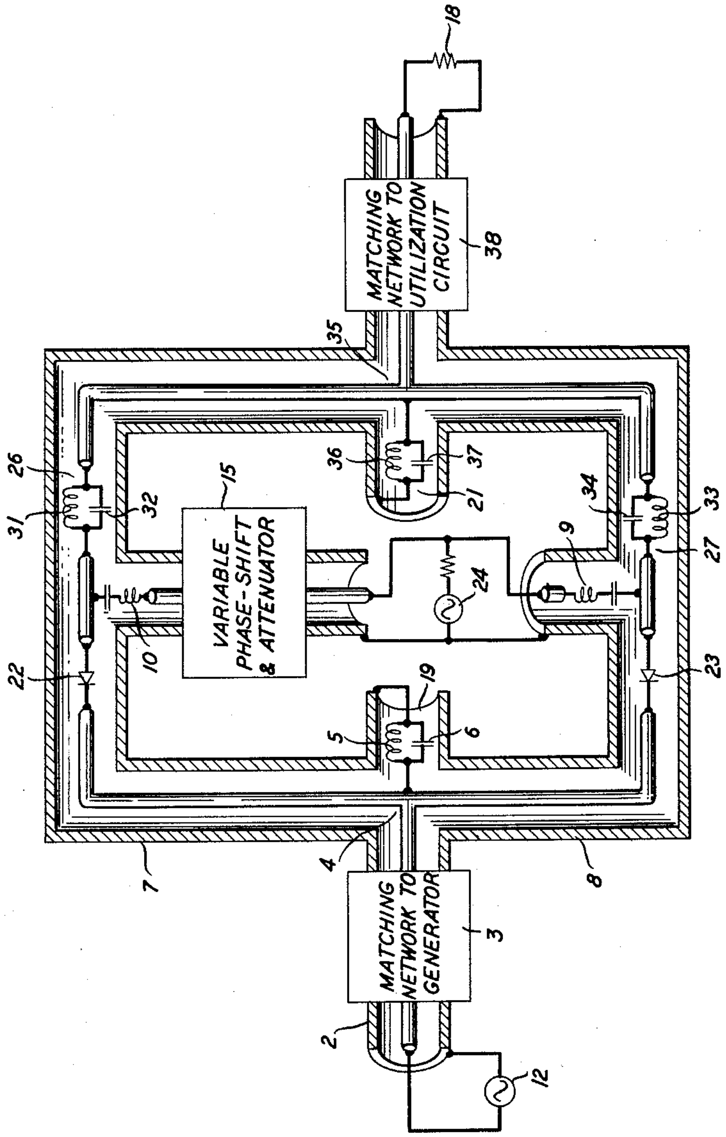
FIG. 3 is a view of a preferred physical embodiment of the circuit of FIG. 1.

In FIG. 3 there is disclosed an actual physical embodiment of the circuit of FIG. 1. For the sake of comprehension, corresponding elements are given the same reference numerals as in FIG. 1. The arrangement of FIG. 3 comprises a signal source 12 connected to a coaxial cable 2. An impedance matching network 3, which may be a simple inductance in shunt with the load, is inserted in cable 2. At point 4, cable 2 is connected to three branch paths, one of which comprises a quarter wavelength line forming filter 19. A parallel combination of an inductance 5 and a capacitance 6 are shown as forming part of filter 19, which performs the function of producing a sharper filter characteristic. From point 4 a second branch path comprises coaxial cable 7 and the third branch path comprises coaxial cable 8. Inserted in cable 7 is a diode varistor 22 which forms the variable resistance element of the device and in cable 8 is a semiconductor diode varactor 23 which forms the nonlinear variable capacitor of the circuit. Pump source 24 supplies pump energy to elements 22 and 23 through coaxial lines and identical filters 9, 10, which are designed to be a short circuit at the pump frequency and a high impedance at all other frequencies. In view of the fact that elements 22 and 23 may not be pure resistance and capacitance, respectively, a variable phase shifter and attenuator 15 is connected to the pump source as shown to insure the proper phase quadrature relationship and amplitudes in the variations of resistor 22 and capacitor 23. Filter 26 is connected to element 22 as shown and is shown as comprising a simple parallel combination of an inductor 31 and a capacitor 32. In like manner, filter 27, connected to element 23, comprises a parallel combination of an inductor 33 and capacitor 34. The two branch circuits containing elements 22 and 23 are connected to point 35, to which is also connected filter 21, shown as comprising a quarter wavelength stub containing a parallel combination of an inductor 36 and capacitor 37. Connected to point 35 through a simple impedance matching network 38 is the load or utilization device 18, shown schematically as a simple resistor.

Figure 4:
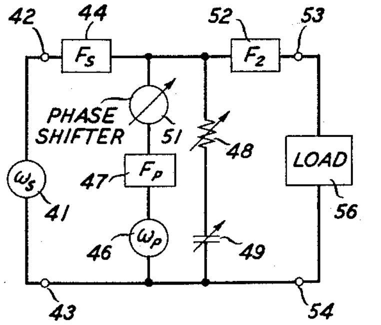
FIG. 4 is a diagrammatic view of a second illustrative embodiment of the invention.

The arrangement of FIGS. 1 and 3 included a variable resistance and a variable capacitance in parallel relationship with each other. It can readily be appreciated that it is possible, following the principles of the present invention, to connect the variable resistance and variable capacitance in series with each other. In FIG. 4 there is disclosed a circuit in which the variable elements are so connected. The arrangement of FIG. 4 comprises a source 41 of signals at a frequency $\omega_s$ which is connected to input terminals 42 and 43 of the circuit. A filter 44, which is designed to be a short circuit at the frequency $\omega_s$ and an open circuit at all other frequencies, is connected in series with input terminal 42 of the circuit. A source 46 of pump energy at a frequency $\omega_p$ is connected across the input terminals 42 and 43, as shown, and a filter 47 which is designed to be a short circuit at the pump frequency and an open circuit at all other frequencies, is connected in series with the pump source. Connected in parallel relationship with the source 46 of pump energy is a nonlinear variable resistance 48 which, as in the case of the circuit 11 of FIG. 1, can be a varistor diode or other suitable type of variable resistance, and in series therewith a nonlinear variable capacitor 49, which may be a semiconductor varactor diode. In order that the proper phase relationships may be obtained, a phase shifter 51 is included in the branch of the circuit containing the pump source. A filter 52, which is designed to be a short circuit at the output frequency or at the two output frequencies, as discussed in connection with FIG. 1, is connected in series with output terminals 53 and 54 to which are connected a load or utilization device 56.

In operation, the circuit of FIG. 4 up-converts and amplifies in the same manner as the circuit of FIG. 1. However, the phase relationship of the variations of resistor 48 and capacitor 49 is such that as the capacitance decreases, i.e., energy being introduced into the circuit, the resistor 48 is at its minimum value, and as the capacitance of capacitor 49 increases, i.e., energy being extracted from the circuit, the resistance of resistor 48 is at a maximum value. It can readily be seen, therefore, that during the amplification portion of the cycle the effect of the resistor 48 is negligible. On the other hand, during the energy extraction or de-amplification portion of the cycle the resistor 48 is at its maximum value and, therefore, the effect of the variation of capacitor 49 on the signal is negligible. In all other respects the circuit of FIG. 4 produces the same results as the circuit of FIG. 1 and the mathematical relationship expressed in Equation 3 is applicable to the circuit of FIG. 4.

In the foregoing, the various illustrative embodiments of my invention involved a simple step of up-conversion with amplification, with no other operation being performed on the output of the circuit.

Figure 5:
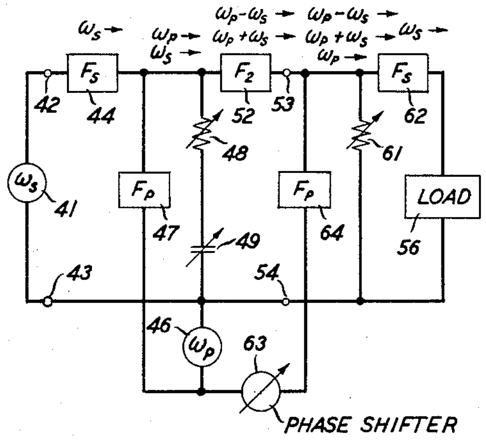
FIG. 5 is a diagrammatic view of still another illustrative embodiment of the invention.

In FIG. 5 there is shown a circuit utilizing the principles of the present invention in which the final output is an amplified version of the input signal at the input signal frequency. The arrangement of FIG. 5 is quite similar in some respects to the circuit of FIG. 4 and, for simplicity, identical components are designated by the same reference numerals. The circuit of FIG. 5 comprises a source of signals 41 connected across input terminals 42 and 43. A filter 44, which is a short circuit at the frequency $\omega_s$, is connected in series with input terminal 42. Connected across the circuit, as in the circuit of FIG. 4, are a nonlinear variable resistor 48 and a nonlinear variable capacitor 49. A filter 52, which is designed to be a short circuit at both output frequencies of the up-converter, i.e., $(\omega_p+\omega_s)$ and $(\omega_p-\omega_s)$, is connected in series with an output terminal 53. A source of pump energy 46 supplies pump energy to resistor 48 and capacitor 49 through a filter 47, which is designed to be a short circuit at the pump frequency $\omega_p$. Connected across output terminals 53, 54 is a circuit which comprises a nonlinear variable resistance 61 and a load or utilization device 56, between which is connected a filter 62, which is designed to be a short circuit at the signal frequency $\omega_s$ and an open circuit at all other frequencies. A source of pump energy 46 is connected as shown so that pump energy is supplied through a phase shifting network 63 and a filter 64 to the variable resistance 61.

In operation, signals at a frequency $\omega_s$ are applied to the input terminals 42, 43 and passed through the filter 44. Pump energy at a frequency $\omega_p$ is likewise applied to the circuit through the filter 47 so that incident upon the series combination of variable resistor 48 and variable capacitor 49 are signals at the frequency $\omega_s$ and pump energy at the frequency $\omega_p$. As a result of the up-conversion operation which has been explained heretofore, two output frequencies are obtained which represent the inverting and the noninverting cases of up-conversion and these frequencies, $(\omega_p-\omega_s)$ and $(\omega_p+\omega_s)$, pass through filter 52 and are applied to variable resistance 61, which may be a nonlinear varistor diode of a type well known in the art, along with pump energy at the frequency $\omega_p$. Resistor 61 functions as a coherent amplitude demodulator in a manner well known in the art to produce a signal output at a frequency $\omega_s$ by virtue of the demodulation of the energy at $\omega_p-\omega_s$, and also to produce in additive fashion an output $\omega_s$ by virtue of the demodulation of the energy at $\omega_p+\omega_s$. These two outputs at a frequency $\omega_s$ are passed through the filter 62 to load 56. It can be readily appreciated that with this arrangement the gain which accrued to both output frequencies of the up-converter is utilized in the final output of the circuit that is fed to the load, and furthermore the output fed to the load is at the original signal frequency.

In the various foregoing embodiments, parallel and series combinations of a nonlinear variable resistor and a nonlinear variable capacitor were described in which the nonlinear devices were pumped in phase quadrature. It will be readily apparent to workers skilled in the art that by duality a nonlinear variable inductance can be substituted in every case for the nonlinear variable capacitance, in which case the parallel combination of nonlinear resistor and nonlinear capacitance would become a series combination of nonlinear inductance and nonlinear resistance, and the series combination of nonlinear capacitance and nonlinear resistance would become a parallel combination of nonlinear inductance and nonlinear resistance. For simplicity, most of the various circuits having been shown in simple line and block diagrams. It can be readily appreciated that in an actual physical structure using, for example, waveguides at microwave frequencies, various types of filtering arrangements well known in the waveguide art could be used to achieve the desired results.

The foregoing disclosed embodiments of my invention are intended to be illustrative of the principles thereof. Various other embodiments will be readily apparent to workers skilled in the art without departing from the spirit and scope of the present invention.

What is claimed is:

1. An amplifier circuit comprising, in combination, a source of signals to be amplified, a frequency converting network connected to said source, said network comprising a nonlinear variable resistance and a nonlinear variable reactance, means for supplying pump energy to said resistance and said reactance in phase quadrature comprising a source of pump energy connected to said network, the frequencies of the pump energy and the signals being so related as to produce parametric amplification, and a utilization circuit connected to the output of the network.

2. A frequency converting network comprising input terminals for receiving an applied signal and output terminals for supplying a load, a nonlinear variable resistance, a nonlinear variable reactance, and means for varying said resistance and said reactance in phase quadrature relationship comprising a source of pump frequency energy connected to said network, the signal and pump frequencies being so related as to produce parametric frequency conversion.

3. A frequency converting network comprising input terminals for receiving an applied signal and output terminals for supplying a load, a nonlinear variable resistance connected between the input and output terminals, a nonlinear variable reactance connected between the input and output terminals, said resistance and said reactance being connected in parallel, and means for varying said resistance and said reactance in phase quadrature relationship comprising a source of pump frequency energy connected in series with said resistance and said reactance, the signal and pump frequencies being so related as to produce parametric frequency conversion.

4. A frequency converting network as claimed in claim 3 wherein said variable reactance comprises a nonlinear variable capacitance.

5. A frequency converting network comprising a pair of input terminals for receiving an applied signal and a pair of output terminals for supplying a load, a nonlinear variable resistance and a nonlinear variable capacitance connected in series with each other and in shunt with said input and output terminals, and means for varying said resistance and said reactance in phase quadrature relationship comprising a source of pump frequency energy connected in shunt with said resistance and said reactance, the signal and pump frequencies being so related as to produce parametric frequency conversion.

6. A frequency converting network as claimed in claim 5 wherein said variable reactance comprises a variable capacitance.

7. An amplifier circuit comprising, in combination, a source of signals to be amplified, a frequency converting network connected to said source, said network comprising a first nonlinear variable resistance and a nonlinear variable reactance, a demodulator circuit connected to said frequency conversion network, said demodulator circuit comprising a second nonlinear variable resistance, means for supplying pump energy to said first resistance and said reactance in phase quadrature and to said second resistance comprising a source of pump energy connected to said frequency converting network and to said demodulator circuit, the frequencies of the pump energy and the signals being so related as to produce parametric amplification, and a utilization circuit connected to the output of the network.

8. An amplifier circuit comprising, in combination, a source of signals at a first frequency, a frequency converting network connected to said source, said network having input and output terminals and comprising a filter which is an open circuit at said first frequency connected in shunt with said source, a nonlinear variable resistance and a nonlinear variable reactance connected in parallel relation with each other and in series with said source, means for varying said resistance and said reactance at a second frequency and in phase quadrature relative to each other comprising a source of energy at said second frequency and a variable phase shifter connected to said resistance and said reactance, said first and second frequencies being so related as to produce parametric amplification, means for blocking energy at said second frequency from said output terminals, and a utilization circuit connected to said output terminals.

9. An amplifier circuit comprising, in combination, a source of signals at a first frequency, a frequency converting network connected to said source, said network having input and output terminals and comprising filter means in series with said source for passing only said first frequency, a nonlinear variable resistance and a nonlinear variable reactance in series with each other and in parallel relationship with said source, means for varying said resistance and said reactance at a second frequency and in phase quadrature relative to each other comprising a source of energy at said second frequency and a variable phase shifter connected in shunt with said resistance and said reactance, said first and second frequencies being so related as to produce parametric amplification, means for blocking energy at said first and second frequencies from said output terminals, and a utilization circuit connected to said output terminals.

10. An amplifier circuit comprising, in combination, a source of signals at a first frequency, a frequency converting network connected to said source, said network having input and output terminals and comprising filter means in series with said source for passing only said first frequency, a first nonlinear variable resistance and a nonlinear variable reactance in series with each other and in parallel relationship with said source, means for varying said resistance and said reactance at a second frequency and in phase quadrature relative to each other comprising a source of energy at said second frequency in shunt with said resistance and said reactance, said first and second frequencies being so related as to produce parametric amplification, means for blocking energy at said first and second frequencies from said output terminals, a demodulator circuit connected to said output terminals, said demodulator circuit comprising a second nonlinear variable resistance connected across said output terminals, said source of energy at said second frequency being connected to said demodulator circuit, and a utilization circuit connected to said demodulator circuit.

No references cited.